(12) United States Patent
Yokoyama et al.

(10) Patent No.: US 10,250,218 B2
(45) Date of Patent: Apr. 2, 2019

(54) PIEZOELECTRIC THIN FILM RESONATOR AND FILTER

(71) Applicant: TAIYO YUDEN CO., LTD., Tokyo (JP)

(72) Inventors: Tsuyoshi Yokoyama, Tokyo (JP); Takeshi Sakashita, Tokyo (JP); Shinji Taniguchi, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 152 days.

(21) Appl. No.: 15/357,644

(22) Filed: Nov. 21, 2016

(65) Prior Publication Data

US 2017/0170807 A1 Jun. 15, 2017

(30) Foreign Application Priority Data

Dec. 9, 2015 (JP) .................. 2015-240563

(51) Int. Cl.
*H03H 9/02* (2006.01)
*H03H 9/17* (2006.01)
(Continued)

(52) U.S. Cl.
CPC ........ *H03H 9/02118* (2013.01); *H03H 9/171* (2013.01); *H03H 9/173* (2013.01);
(Continued)

(58) Field of Classification Search
CPC .... H03H 9/02118; H03H 9/171; H03H 9/173; H03H 9/175; H03H 9/54; H03H 9/587; H03H 9/605
(Continued)

(56) References Cited

U.S. PATENT DOCUMENTS 8,084,919 B2 * 12/2011 Nishihara .......... H03H 9/02118
310/320
9,203,374 B2 12/2015 Burak et al.
(Continued)

FOREIGN PATENT DOCUMENTS

JP 2006-109472 A 4/2006
JP 2010-045437 A 2/2010
(Continued)

OTHER PUBLICATIONS

Japanese Office Action dated Jan. 30, 2018, in a counterpart Japanese patent application No. 2015-240563. (A machine translation (not reviewed for accuracy) attached.)
(Continued)

*Primary Examiner* — Robert J Pascal
*Assistant Examiner* — Jorge L Salazar, Jr.
(74) *Attorney, Agent, or Firm* — Chen Yoshimura LLP

(57) ABSTRACT

A piezoelectric thin film resonator includes: a substrate; a lower electrode and an upper electrode located on the substrate; a piezoelectric film, at least a part of the piezoelectric film being sandwiched between the upper electrode and the lower electrode, the piezoelectric film including a discontinuous portion in which the piezoelectric film discontinues in at least a part of a region surrounding a center region that includes a center of a resonance region where the upper electrode and the lower electrode face each other across the at least a part of the piezoelectric film.

13 Claims, 14 Drawing Sheets

(51) Int. Cl.
*H03H 9/54* (2006.01)
*H03H 9/58* (2006.01)
*H03H 9/60* (2006.01)

(52) U.S. Cl.
CPC .............. *H03H 9/175* (2013.01); *H03H 9/54* (2013.01); *H03H 9/587* (2013.01); *H03H 9/605* (2013.01)

(58) Field of Classification Search
USPC ........................................ 333/133, 187, 188
See application file for complete search history.

(56) References Cited

U.S. PATENT DOCUMENTS

| | | |
|---|---|---|
| 2006/0071736 A1 | 4/2006 | Ruby et al. |
| 2006/0103492 A1 | 5/2006 | Feng et al. |
| 2008/0179995 A1 | 7/2008 | Umeda et al. |
| 2010/0033063 A1 | 2/2010 | Nishihara et al. |
| 2011/0084779 A1 | 4/2011 | Zhang |
| 2014/0210570 A1 | 7/2014 | Nishihara et al. |
| 2015/0130560 A1 | 5/2015 | Yokoyama et al. |

FOREIGN PATENT DOCUMENTS

| | | |
|---|---|---|
| JP | 2014-161001 A | 9/2014 |
| JP | 2015-95714 A | 5/2015 |
| WO | 2007/052370 A1 | 5/2007 |

OTHER PUBLICATIONS

Japanese Office Action dated Jun. 19, 2018, in a counterpart Japanese patent application No. 2015-240563. (A machine translation (not reviewed for accuracy) attached.).

* cited by examiner

FIG. 3A
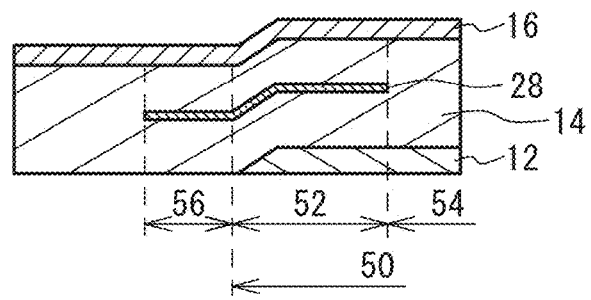
FIG. 3B
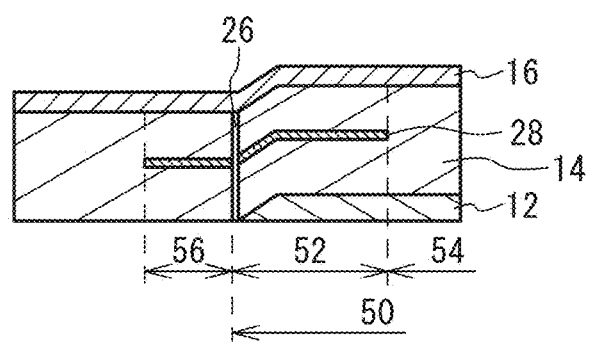
FIG. 3C
| | Qr | Qa | k² |
|---|---|---|---|
| FIRST COMPARATIVE EXAMPLE | 2385 | 2144 | 6.9 |
| FIRST EMBODIMENT | 2680 | 2282 | 7.0 |

FIG. 4

|  | Qr | Qa | $k^2$ |
|---|---|---|---|
| FIRST COMPAR-ATIVE EXAMPLE | 1625 | 1730 | 6.8 |
| FIRST EMBODIMENT | 1640 | 1867 | 6.8 |

FIG. 6A
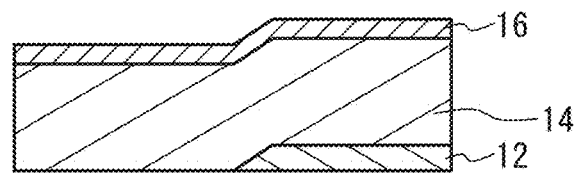
FIG. 6B
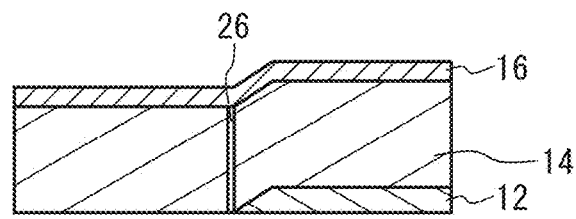
FIG. 6C
|  | Qr | Qa | k² |
|---|---|---|---|
| SECOND COMPAR-ATIVE EXAMPLE | 2090 | 880 | 7.0 |
| SECOND EMBODIMENT | 2057 | 1005 | 7.2 | ively
PIEZOELECTRIC THIN FILM RESONATOR AND FILTER

CROSS-REFERENCE TO RELATED APPLICATION

This application is based upon and claims the benefit of priority of the prior Japanese Patent Application No. 2015-240563, filed on Dec. 9, 2015, the entire contents of which are incorporated herein by reference.

FIELD

A certain aspect of the present invention relates to a piezoelectric thin film resonator and a filter.

BACKGROUND

Acoustic wave devices using piezoelectric thin film resonators are used as filters and duplexers in wireless devices such as, for example, mobile phones. The piezoelectric thin film resonator has a structure designed to have a lower electrode and an upper electrode facing each other across the piezoelectric film. A region where the lower electrode and the upper electrode face each other across the piezoelectric film is a resonance region.

Rapid diffusion of wireless systems has promoted the use of many frequency bands. Thus, filters and duplexers with steeper skirt characteristics have been desired. One way of making the skirt characteristic steeper is to increase the Q-value of the piezoelectric thin film resonator.

Japanese Patent Application Publication No. 2006-109472 (Patent Document 1) discloses a piezoelectric thin film resonator including an annulus positioned on the surface of one of the upper electrode and the lower electrode. Japanese Patent Application Publication No. 2014-161001 (Patent Document 2) discloses a piezoelectric thin film resonator in which an insertion film is inserted into the piezoelectric film in the outer peripheral region of the resonance region. Japanese Patent Application Publication No. 2015-95714 (Patent Document 3) discloses a piezoelectric thin film resonator in which an air gap is inserted into the piezoelectric film in the outer peripheral region of the resonance region.

The piezoelectric thin film resonators disclosed in Patent Documents 1 through 3 can inhibit acoustic wave energy from leaking from the resonance region, and improve the Q-value. However, it is difficult to sufficiently reduce the leak of the acoustic wave energy from the resonance region, and the degree of the improvement of the Q-value is insufficient.

SUMMARY OF THE INVENTION

According to an aspect of the present invention, there is provided a piezoelectric thin film resonator including: a substrate; a lower electrode and an upper electrode located on the substrate; a piezoelectric film, at least a part of the piezoelectric film being sandwiched between the upper electrode and the lower electrode, the piezoelectric film including a discontinuous portion in which the piezoelectric film discontinues in at least a part of a region surrounding a center region that includes a center of a resonance region where the upper electrode and the lower electrode face each other across the at least a part of the piezoelectric film.

According to another aspect of the present invention, there is provided a filter including: the above piezoelectric thin film resonator.

BRIEF DESCRIPTION OF THE DRAWINGS

FIG. 3A and FIG. 3B illustrate cross-sections of piezoelectric film resonators of a first comparative example and the first embodiment used for a simulation, and FIG. 3C illustrates simulation results;

FIG. 4 illustrates measured characteristics of the piezoelectric thin film resonators of the first comparative example and the first embodiment;

FIG. 6A and FIG. 6B illustrate cross-sections of piezoelectric film resonators of a second comparative example and the second embodiment used for a simulation, and FIG. 6C illustrates simulation results;

DETAILED DESCRIPTION

Hereinafter, embodiments of the present invention will be described with reference to the accompanying drawings.

First Embodiment

Figure 1A:
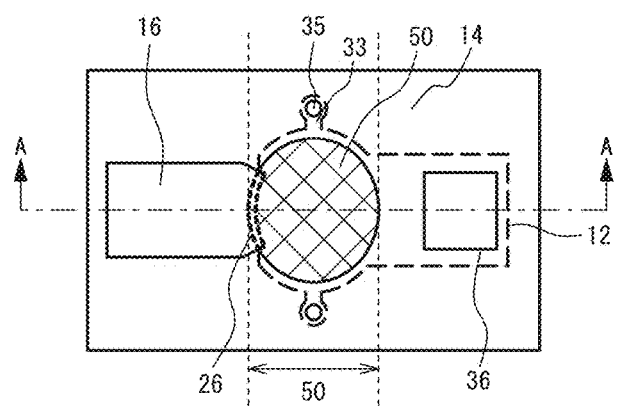
FIG. 1A is a plan view of a piezoelectric thin film resonator in accordance with a first embodiment.
Figure 1B:
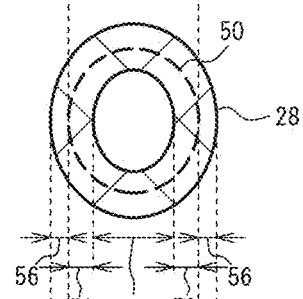
FIG. 1B is a plan view of an insertion film.
Figure 1C:
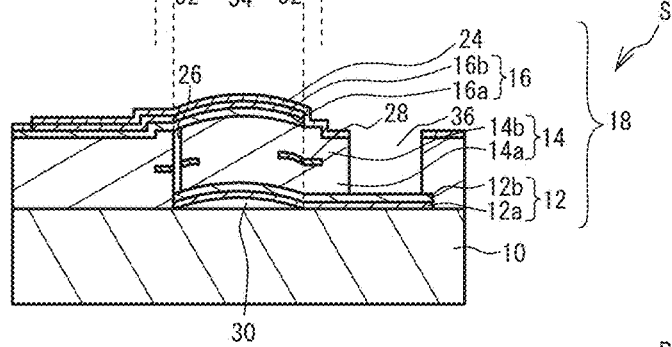
FIG. 1C and FIG. 1D are cross-sectional views taken along line A-A in FIG. 1A.
Figure 1D:
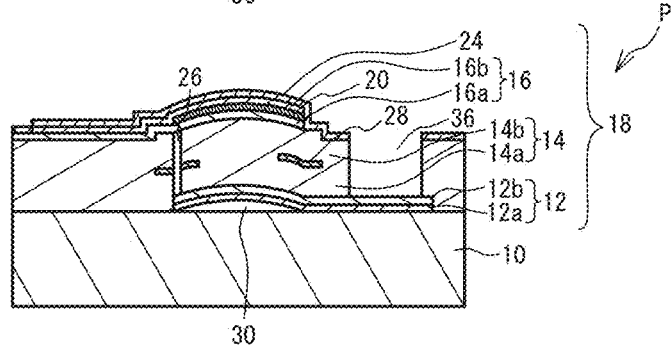

FIG. 1A is a plan view of a piezoelectric thin film resonator in accordance with a first embodiment, FIG. 1B is a plan view of an insertion film, and FIG. 1C and FIG. 1D are cross-sectional views taken along line A-A in FIG. 1A.

FIG. 1C illustrates a series resonator of, for example, a ladder-type filter, and FIG. 1D illustrates a parallel resonator of, for example, a ladder-type filter.

With reference to FIG. 1A and FIG. 1C, the structure of a series resonator S will be described. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30 and increases at closer distances to the center of the air gap 30, for example. The lower electrode 12 includes a lower layer 12a and an upper layer 12b. The lower layer 12a is made of, for example, a chrome (Cr) film, and the upper layer 12b is made of, for example, a ruthenium (Ru) film.

On the lower electrode 12, located is a piezoelectric film 14 mainly composed of aluminum nitride (AlN) having a main axis of (002) direction. The piezoelectric film 14 includes a lower piezoelectric film 14a and an upper piezoelectric film 14b. An insertion film 28 is located between the lower and upper piezoelectric films 14a and 14b.

An upper electrode 16 is located on the piezoelectric film 14 so as to have a region (a resonance region 50) in which the upper electrode 16 faces the lower electrode 12 across the piezoelectric film 14. The resonance region 50 has an elliptical shape, and is a region in which the acoustic wave in the thickness extension mode resonates. The upper electrode 16 includes a lower layer 16a and an upper layer 16b. The lower layer 16a is made of, for example, a Ru film, and the upper layer 16b is made of, for example, a Cr film.

On the upper electrode 16, formed is a silicon oxide film as a frequency adjusting film 24. A multilayered film 18 in the resonance region 50 includes the lower electrode 12, the piezoelectric film 14, the insertion film 28, the upper electrode 16, and the frequency adjusting film 24. The frequency adjusting film 24 may act as a passivation film. An aperture 36 from which the lower electrode 12 is exposed is formed in the piezoelectric film 14. The aperture 36 is used to electrically connect the lower electrode 12 to an external element.

In a part of the outer periphery of the resonance region 50 (i.e., the boundary between the resonance region 50 and the outside of the resonance region 50), formed is a discontinuous portion 26 that penetrates through the piezoelectric film 14 and the insertion film 28 in the film thickness direction. The discontinuous portion 26 is, for example, a crack of the piezoelectric film 14 and the insertion film 28, or an air gap. In the discontinuous portion 26, the propagation of the acoustic wave is disturbed.

As illustrated in FIG. 1A, in the lower electrode 12, formed is an introduction path 33 for etching a sacrifice layer. The sacrifice layer is a layer for forming the air gap 30. The vicinity of the tip of the introduction path 33 is not covered with the piezoelectric film 14, and the lower electrode 12 includes a hole portion 35 at the tip of the introduction path 33.

With reference to FIG. 1D, the structure of a parallel resonator P will be described. The parallel resonator P differs from the series resonator S in that the parallel resonator P includes a mass load film 20 made of a titanium (Ti) layer between the lower and upper layers 16a and 16b of the upper electrode 16. Thus, the multilayered film 18 includes, in addition to the multilayered film of the series resonator S, the mass load film 20 formed across the entire surface in the resonance region 50. Other configurations are the same as those of the series resonator S illustrated in FIG. 1C, and thus the description is omitted.

The film thickness of the mass load film 20 is used to adjust the difference in resonant frequency between the series resonator S and the parallel resonator P. The resonant frequency of each of the series resonator S and the parallel resonator P is adjusted by adjusting the film thickness of the frequency adjusting film 24.

In the present embodiment, the piezoelectric thin film resonator with a resonant frequency of 2 GHz is configured as follows. The lower layer 12a of the lower electrode 12 is made of a Cr film with a film thickness of 100 nm, and the upper layer 12b is made of a Ru film with a film thickness of 200 nm. The piezoelectric film 14 is made of an AlN film with a film thickness of 1260 nm. The insertion film 28 is made of a silicon oxide ($SiO_2$) film with a film thickness of 150 nm. The insertion film 28 is located in the middle of the piezoelectric film 14 in the film thickness direction. The lower layer 16a of the upper electrode 16 is made of a Ru film with a film thickness of 230 nm, and the upper layer 16b is made of a Cr film with a film thickness of 50 nm. The frequency adjusting film 24 is made of a silicon oxide film with a film thickness of 50 nm. The mass load film 20 is made of a Ti film with a film thickness of 120 nm. The film thickness of each layer can be appropriately configured to obtain desired resonance characteristics.

As illustrated in FIG. 1B, the insertion film 28 is located in an outer peripheral region 52 within the resonance region 50 but is not located in a center region 54. The outer peripheral region 52 is located within the resonance region 50, includes the outer periphery of the resonance region 50, and is located along the outer periphery. The outer peripheral region 52 is, for example, strip-shaped or ring-shaped. The center region 54 is located within the resonance region 50, and includes the center of the resonance region 50. The center may not be the geometric center. The insertion film 28 is located in the outer peripheral region 52 and in a region 56 surrounding the resonance region 50. As disclosed in Patent Document 2, the insertion film 28 preferably has a Young's modulus less than the Young's modulus of the piezoelectric film 14. When the insertion film 28 and the piezoelectric film 14 have an approximately identical density, the insertion film 28 preferably has an acoustic impedance less than the acoustic impedance of the piezoelectric film 14 because a Young's modulus correlates with an acoustic impedance. This configuration improves the Q-value. In addition, when the insertion film 28 is made of a metal film, the effective electromechanical coupling coefficient is improved. Furthermore, to make the acoustic impedance of the insertion film 28 less than the acoustic impedance of the piezoelectric film 14, when the piezoelectric film 14 is mainly composed of aluminum nitride, the insertion film 28 is preferably made of an Al film, a gold (Au) film, a copper (Cu) film, a Ti film, a platinum (Pt) film, a tantalum (Ta) film, a Cr film, or a silicon oxide film. Considering Young's modulus, the insertion film 28 is preferably made of, especially, an Al film or a silicon oxide film.

The substrate 10 may be, instead of a Si substrate, a quartz substrate, a glass substrate, a ceramic substrate, or a GaAs substrate. The lower electrode 12 and the upper electrode 16 may be made of, instead of Ru and Cr, a single-layer film of Al, Ti, Cu, molybdenum (Mo), tungsten (W), Ta, Pt, rhodium (Rh), or iridium (Ir), or a multilayered film of at least two of them. For example, the lower layer 16a of the upper electrode 16 may be made of Ru, and the upper layer 16b may be made of Mo.

The piezoelectric film 14 may be made of, instead of aluminum nitride, zinc oxide (ZnO), lead zirconate titanate (PZT), or lead titanate (PbTiO$_3$). Alternatively, for example, the piezoelectric film 14 may be mainly composed of aluminum nitride, and contain other elements for improving the resonance characteristic or improving the piezoelectricity. For example, the use of scandium (Sc), divalent and quadrivalent elements, or divalent and pentavalent elements as an additive element improves the piezoelectricity of the piezoelectric film 14. Thus, the effective electromechanical coupling coefficient of the piezoelectric thin film resonator can be improved. The divalent element is, for example, calcium (Ca), magnesium (Mg), strontium (Sr), or zinc (Zn). The quadrivalent element is, for example, Ti, zirconium (Zr), or hafnium (Hf). The pentavalent element is, for example, Ta, niobium (Nb), or vanadium (V). Furthermore, the piezoelectric film 14 may be mainly composed of aluminum nitride, and contain boron (B).

The frequency adjusting film 24 may be made of, instead of a silicon oxide film, a silicon nitride film or an aluminum nitride. The mass load film 20 may be made of a single-layer film of Ru, Cr, Al, Cu, Mo, W, Ta, Pt, Rh, or Ir instead of Ti. Alternatively, for example, the mass load film 20 may be made of an insulating film made of metal nitride such as silicon nitride or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower and upper layers 16a and 16b). The mass load film 20 may be larger than the resonance region 50 as long as the mass load film 20 is formed so as to include the resonance region 50.

Figure 2A:
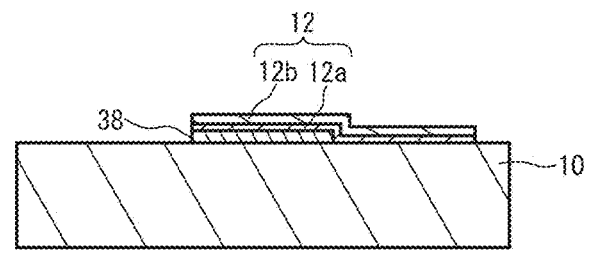
FIG. 2A through FIG. 2C are cross-sectional views illustrating a method of fabricating a series resonator of the first embodiment.
Figure 2B:
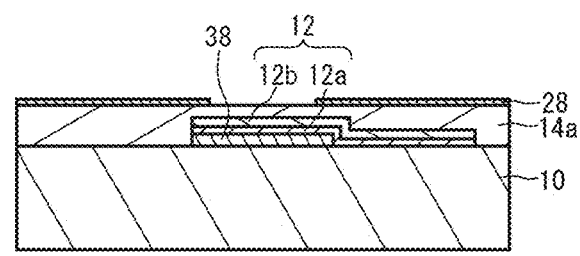
Figure 2C:
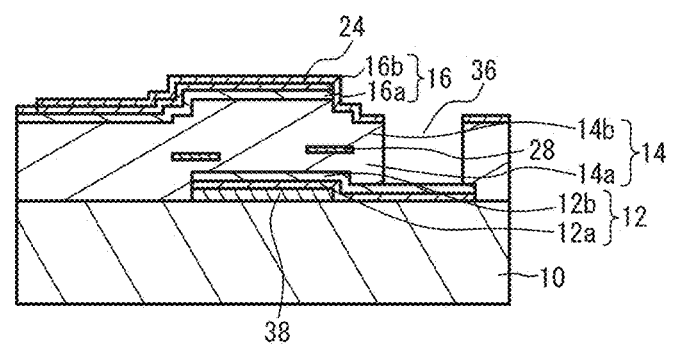

FIG. 2A through FIG. 2C are cross-sectional views illustrating a method of fabricating the series resonator of the first embodiment. As illustrated in FIG. 2A, on the substrate 10 having a flat principal surface, formed is a sacrifice layer 38 for forming an air gap. The sacrifice layer 38 has a film thickness of, for example, 10 to 100 nm, and is made of a substance selected from substances such as magnesium oxide (MgO), ZnO, germanium (Ge) and silicon oxide (SiO$_2$) that easily dissolve in an etching liquid or an etching gas. Then, the sacrifice layer 38 is patterned into a desired shape by photolithography and etching. The sacrifice layer 38 has a shape corresponding to the planar shape of the air gap 30 and including a region to be, for example, the resonance region 50. Then, on the sacrifice layer 38 and the substrate 10, formed are the lower layer 12a and the upper layer 12b as the lower electrode 12. The sacrifice layer 38 and the lower electrode 12 are formed by, for example, sputtering, vacuum evaporation, or Chemical Vapor Deposition (CVD). Then, the lower electrode 12 is patterned into a desired shape by photolithography and etching. The lower electrode 12 may be formed by liftoff.

As illustrated in FIG. 2B, the lower piezoelectric film 14a is formed on the lower electrode 12 and the substrate 10 by, for example, sputtering, vacuum evaporation, or CVD. The insertion film 28 is formed on the lower piezoelectric film 14a by, for example, sputtering, vacuum evaporation, or CVD. Then, the insertion film 28 is patterned into a desired shape by photolithography and etching. The insertion film 28 may be formed by liftoff. Forming the edge portion of the insertion film 28 in a tapered shape inhibits cracks from being formed in the lower piezoelectric film 14a and the upper electrode 16 formed on the insertion film 28.

As illustrated in FIG. 2C, the upper piezoelectric film 14b, and the lower and upper layers 16a and 16b of the upper electrode 16 are formed by, for example, sputtering, vacuum evaporation, or CVD. The lower and upper piezoelectric films 14a and 14b form the piezoelectric film 14. The upper electrode 16 is patterned into a desired shape by photolithography and etching. The upper electrode 16 may be formed by liftoff.

In the parallel resonator illustrated in FIG. 1D, after the lower layer 16a of the upper electrode 16 is formed, the mass load film 20 is formed by, for example, sputtering, vacuum evaporation, or CVD. The mass load film 20 is patterned into a desired shape by photolithography and etching. Then, the upper layer 16b of the upper electrode 16 is formed.

The frequency adjusting film 24 is formed by, for example, sputtering or CVD. The frequency adjusting film 24 is then patterned into a desired shape by photolithography and etching.

Then, an etching liquid for etching the sacrifice layer 38 is introduced into the sacrifice layer 38 under the lower electrode 12 through the hole portion 35 and the introduction path 33 (see FIG. 1A). This process removes the sacrifice layer 38. A substance for etching the sacrifice layer 38 is preferably a substance that does not etch materials constituting the resonator except the sacrifice layer 38. Especially, a substance for etching is preferably a substance that does not etch the lower electrode 12 with which the substance for etching comes in contact. The stress on the multilayered film 18 (see FIG. 1C, FIG. 1D) is set to be a compression stress. This configuration allows the multilayered film 18 to bulge out toward the opposite side from the substrate 10 so as to separate from the substrate 10 when the sacrifice layer 38 is removed. Accordingly, the air gap 30 having a dome-shaped bulge is formed between the lower electrode 12 and the substrate 10. At this time, a crack is formed in the piezoelectric film 14 because of the compression stress by making the tip of the lower electrode 12 substantially coincide with the tip of the sacrifice layer 38. The crack forms the discontinuous portion 26 of the piezoelectric film 14 in the boundary between the resonance region 50 and the outside of the resonance region 50. The above described processes complete the series resonator S illustrated in FIG. 1A and FIG. 1C, and the parallel resonator P illustrated in FIG. 1A and FIG. 1D.

The characteristics of the piezoelectric thin film resonator in accordance with first embodiment were simulated by a two-dimensional finite element method. FIG. 3A and FIG. 3B illustrate cross-sections of piezoelectric thin film resonators of the first comparative example and the first embodiment used for the simulation. FIG. 3C illustrates simulation results.

As illustrated in FIG. 3A, in the first comparative example, the insertion film 28 is located in the outer peripheral region 52 and the region 56. The tip of the lower electrode 12 is formed in a tapered shape. The piezoelectric film 14 is continuously located between the resonance region 50 and the region 56. As illustrated in FIG. 3B, the discontinuous portion 26 is formed between the resonance region 50 and the region 56, and the piezoelectric film 14 is discontinuously located. The lower electrode 12 was configured to be formed of a lower layer made of a Cr film with a film thickness of 100 nm and an upper layer made of a Ru film with a film thickness of 250 nm. The piezoelectric film 14 was configured to be made of an AlN film with a film thickness of 1260 nm. The insertion film 28 was configured to be located in the middle of the piezoelectric film 14 in the film thickness direction, and made of a SiO$_2$ film with a film thickness of 100 nm. The upper electrode 16 was configured to be made of a Ru film with a film thickness of 230 nm. The outer peripheral region 52 was configured to have a width of 2.5 µm, and the region 56 was configured to have a width of 4 µm.

As illustrated in FIG. 3C, a Q-value Qr at the resonant frequency, a Q-value Qa at the antiresonant frequency, and the effective electromechanical coupling coefficient $k^2$ in the first embodiment are greater than those in the first comparative example. This is considered because the leak of the acoustic wave energy from the resonance region 50 is reduced by the discontinuous portion 26.

The piezoelectric thin film resonators of the first embodiment and the first comparative example were fabricated by the fabrication method illustrated in FIG. 2A through FIG. 2C. The material and the film thickness of each film are the same as those of each film of the piezoelectric thin film resonator with a resonant frequency of 2 GHz illustrated in FIG. 1A through FIG. 1C. In the first embodiment, the sacrifice layer 38 and the lower electrode 12 substantially coincide with each other in a region where the discontinuous portion 26 is to be formed, which is illustrated in FIG. 1A. In the first comparative example, the sacrifice layer 38 is located further out than the lower electrode 12. Thus, the discontinuous portion 26 is formed in the first embodiment while the discontinuous portion 26 is not formed in the first comparative example.

FIG. 4 illustrates measured characteristics of the piezoelectric thin film resonators in accordance with the first comparative example and the first embodiment. As illustrated in FIG. 4, the Q-value Qr at the resonant frequency and the Q-value Qa at the antiresonant frequency of the first embodiment are greater than those of the first comparative example. The electromechanical coupling coefficients $k^2$ are approximately the same between the first embodiment and the first comparative example.

Second Embodiment

Figure 5A:
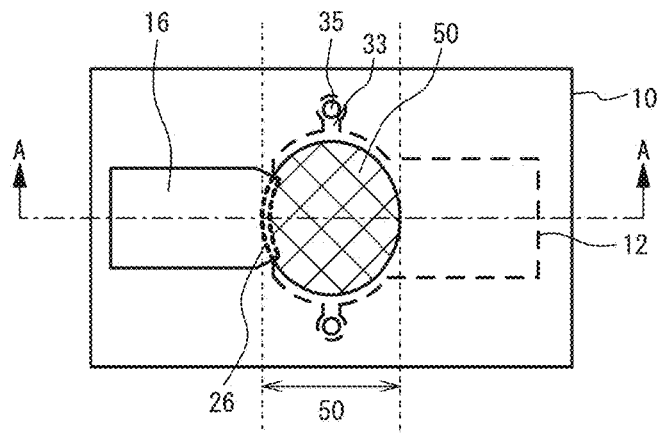
FIG. 5A is a plan view of a piezoelectric thin film resonator in accordance with a second embodiment.
Figure 5B:
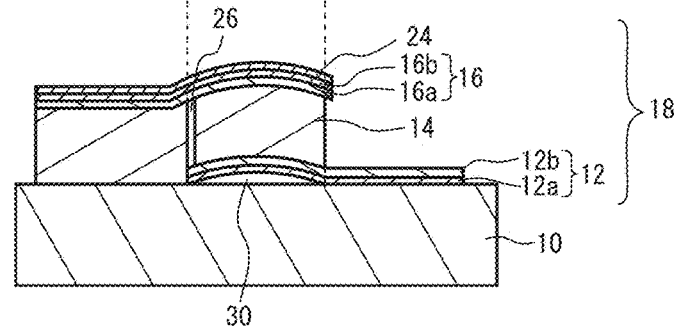
FIG. 5B and FIG. 5C are cross-sectional views taken along line A-A in FIG. 5A.
Figure 5C:
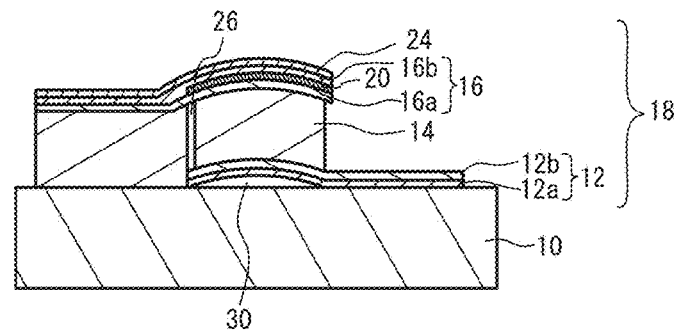

FIG. 5A is a plan view of a piezoelectric thin film resonator in accordance with a second embodiment, and FIG. 5B and FIG. 5C are a cross-sectional views taken along line A-A in FIG. 5A. FIG. 5B illustrates a series resonator of, for example, a ladder-type filter, and FIG. 5C illustrates a parallel resonator of, for example, a ladder-type filter. As illustrated in FIG. 5A through FIG. 5C, in the second embodiment, the insertion film 28 is not inserted into the piezoelectric film 14. The piezoelectric film 14 is located under the upper electrode 16, and the piezoelectric film 14 is removed in a region where the upper electrode 16 is not formed. Other configurations are the same as those of the first embodiment, and thus the description is omitted.

The characteristics of the piezoelectric thin film resonator in accordance with the second embodiment were simulated by the two-dimensional finite element method. FIG. 6A and FIG. 6B illustrate cross-sections of piezoelectric thin film resonators of a second comparative example and the second embodiment used for the simulation. FIG. 6C illustrates simulation results.

As illustrated in FIG. 6A and FIG. 6B, in the second comparative example and the second embodiment, the insertion film 28 is not formed. Other configurations are the same as those illustrated in FIG. 3A and FIG. 3B, and thus the description is omitted. As illustrated in FIG. 6C, the Q-value Qa at the antiresonant frequency and the electromechanical coupling coefficient $k^2$ of the second embodiment are greater than those of the second comparative example. It is considered that the leak of the acoustic wave energy from the resonance region 50 can be reduced by the discontinuous portion 26 even when the insertion film 28 is not formed. Comparison with FIG. 3C reveals that the first embodiment can make the Q-value greater than that of the second embodiment. The second embodiment can make the electromechanical coupling coefficient $k^2$ greater than that of the first embodiment.

Figure 7A:
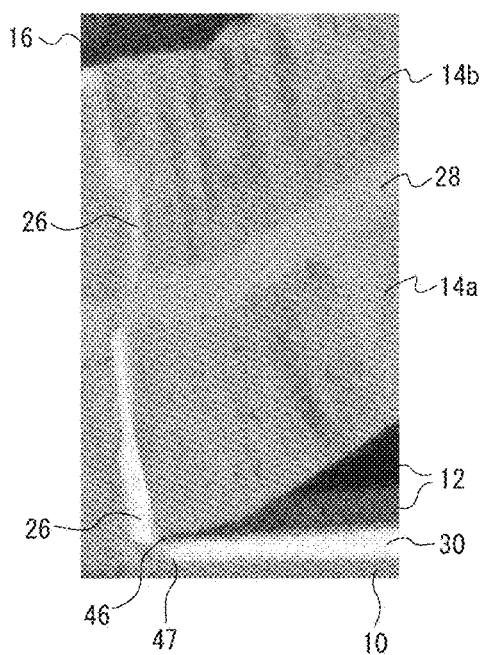
FIG. 7A and FIG. 7B are cross-sectional SEM images of the edges of the resonance regions of the piezoelectric thin film resonators in accordance with the first and second embodiments.
Figure 7B:
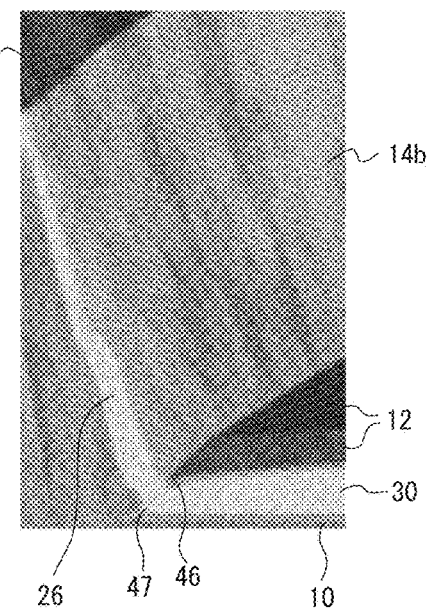

FIG. 7A and FIG. 7B are cross-sectional Scanning Electron Microscope (SEM) images of the edges of the resonance regions of the piezoelectric thin film resonators in accordance with the first and second embodiments. As presented in FIG. 7A, in the first embodiment, an edge portion 46 of the lower electrode 12 substantially coincides with an edge portion 47 of the air gap 30. That is, the edge portion of the lower electrode 12 substantially coincides with the edge portion of the sacrifice layer. Accordingly, the discontinuous portion 26 (a crack) is formed in the piezoelectric film 14 from the edge portion 46 of the lower electrode 12. The discontinuous portion 26 is continuous with the air gap 30. The discontinuous portion 26 penetrates through the lower piezoelectric film 14a, the insertion film 28, and the upper piezoelectric film 14b, and reaches the upper surface of the piezoelectric film 14. The cross-section of the discontinuous portion 26 in the lower piezoelectric film 14a has a triangle shape or a trapezoidal shape having a width increasing toward the lower side. This is because the discontinuous portion 26 is formed when the multilayered film 18 becomes dome-shaped to form the air gap 30.

As illustrated in FIG. 7B, in the second embodiment, the insertion film 28 is not provided. The edge portion 46 of the lower electrode 12 substantially coincides with the edge portion 47 of the air gap 30. The discontinuous portion 26 (a crack) penetrating through the piezoelectric film 14 is formed from the edge portion 46 of the lower electrode 12. The cross-section of the discontinuous portion 26 in the piezoelectric film 14 has a triangle shape or a trapezoidal shape having a width increasing at closer distances to the lower side.

In the first and second embodiments, in at least a part of a region surrounding the center region 54 including the center of the resonance region 50, the discontinuous portion 26 that makes the piezoelectric film 14 discontinuous is provided. This configuration can reduce the leak of the acoustic wave energy from the resonance region 50, and improve the Q-value. To reduce the leak of the energy of the acoustic wave to the outside of the resonance region 50, the discontinuous portion 26 is only required to be located in the outer peripheral region 52 within the resonance region 50 or outside the resonance region 50.

Figure 8:
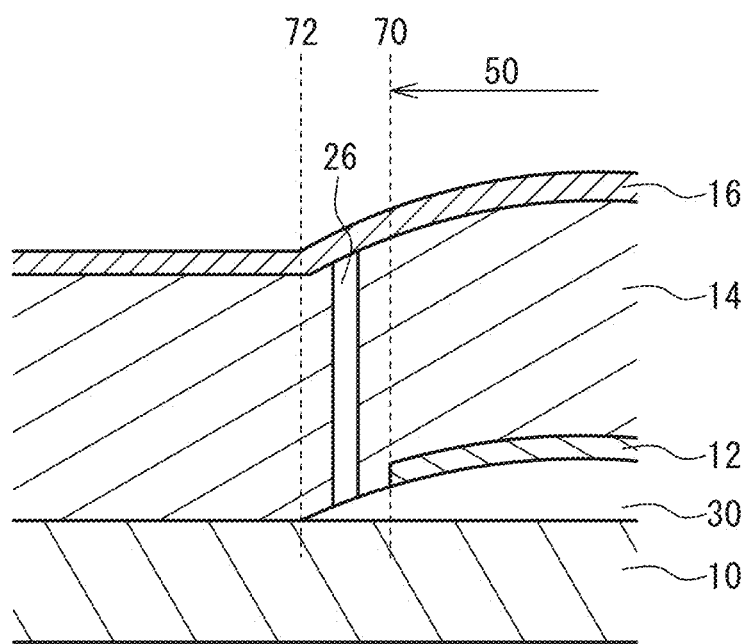
FIG. 8 is a cross-sectional view around the edge portion of the resonance region.

FIG. 8 is a cross-sectional view around the edge portion of the resonance region. As illustrated in FIG. 8, the air gap 30 includes the resonance region 50 and is larger than the resonance region 50 in planar view. That is, an edge portion 72 (i.e., the outline) of the air gap 30 is located further out than an edge portion 70 (i.e., the outline) of the resonance region 50. When the discontinuous portion 26 is formed in the resonance region 50, the resonance characteristic deteriorates. When the discontinuous portion 26 is located further out than the edge portion 72 of the air gap 30, the energy of the acoustic wave leaks from the piezoelectric film 14 to the substrate 10. Thus, the discontinuous portion 26 is preferably located in the edge portion 70, further out than the edge portion 70 of the resonance region 50 and further in than the edge portion 72 of the air gap 30, or in the edge portion 72 of the air gap 30. As described later, when an acoustic mirror is located under the lower electrode 12 instead of the air gap 30, the discontinuous portion 26 is preferably located in the edge portion 70 of the resonance region 50, further out than the edge portion 70 of the resonance region 50 and further in than the edge portion 72 of the acoustic mirror, or in the edge portion 72 of the acoustic mirror. The case where the discontinuous portion 26 is located in the edge portion 70 of the resonance region 50 includes a case where the discontinuous portion 26 is located further in than the edge portion 70 by approximately the wavelength of the acoustic wave propagating through the piezoelectric film 14 in the lateral direction. Even when the discontinuous portion 26 is located further in than the edge portion 70 of the resonance region 50 by approximately the wavelength of the acoustic wave, the resonance characteristic hardly deteriorates.

To reduce the leak of the energy of the acoustic wave from the resonance region 50, the discontinuous portion 26 may be located so as to surround the entire of the center region 54 of the resonance region 50. The discontinuous portion 26 is only required to be located in at least a part of the region surrounding the center region 54 of the resonance region 50. For example, the discontinuous portion 26 may be located an extraction portion of the upper electrode 16. The extraction portion of the upper electrode 16 is a portion that electrically connects the upper electrode 16 in the resonance region 50 to the outside of the resonance region 50.

In other than the extraction portion of the upper electrode 16, the lower electrode 12 is formed to be larger than the resonance region 50. This is to secure a margin for aligning the upper electrode 16 and the lower electrode 12. Thus, when the discontinuous portion 26 is formed by making the edge portion of the sacrifice layer 38 substantially coincide with the edge portion of the lower electrode 12, the discontinuous portion 26 is formed in the extraction region of the upper electrode 16. As in the second embodiment, when the piezoelectric film 14 is removed in the region other than the region where the upper electrode 16 is formed, the leak of the energy of the acoustic wave from the resonance region 50 is reduced in the region other than the extraction region of the upper electrode 16. Accordingly, the provision of the discontinuous portion 26 in the extraction region of the upper electrode 16 can further reduce the leak of the acoustic wave energy from the resonance region 50.

When the discontinuous portion 26 is formed by making the edge portion of the sacrifice layer 38 substantially coincide with the edge portion of the lower electrode 12, the edge portion 47 of the air gap 30 and the edge portion 46 of the lower electrode 12 are located in approximately the same region, and the discontinuous portion 26 is located from the edge portion of the lower electrode 12. Regardless of the sacrifice layer, the discontinuous portion 26 can be formed by the stress from the edge portion of the lower electrode 12. Even in this case, the discontinuous portion 26 is formed from the tip of the lower electrode 12. When the discontinuous portion 26 is formed with a crack, the piezoelectric film 14 is preferably hard. For example, when the piezoelectric film 14 is made of aluminum nitride, the addition of boron makes the piezoelectric film 14 harder.

Third Embodiment

Figure 9A:
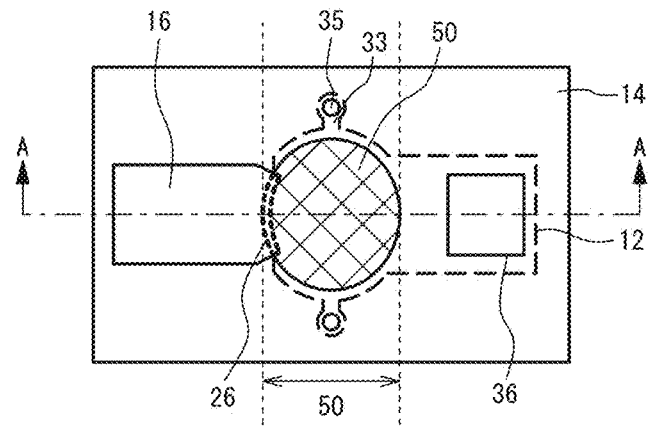
FIG. 9A is a plan view of a piezoelectric thin film resonator in accordance with a third embodiment.
Figure 9B:
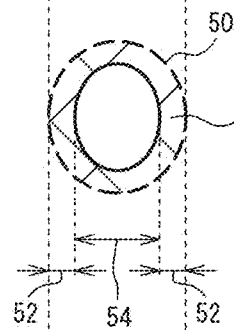
FIG. 9B is a plan view of an insertion film.
Figure 9C:
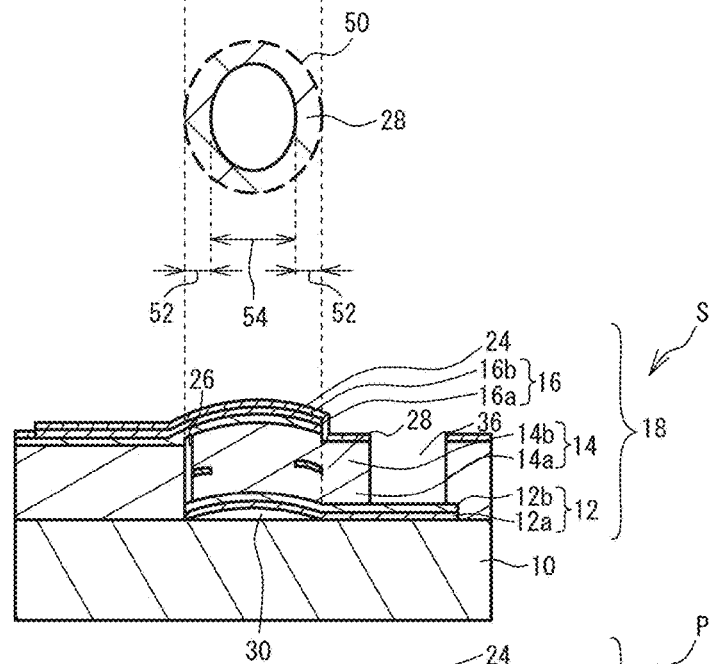
FIG. 9C and FIG. 9D are cross-sectional views taken along line A-A in FIG. 9A.
Figure 9D:
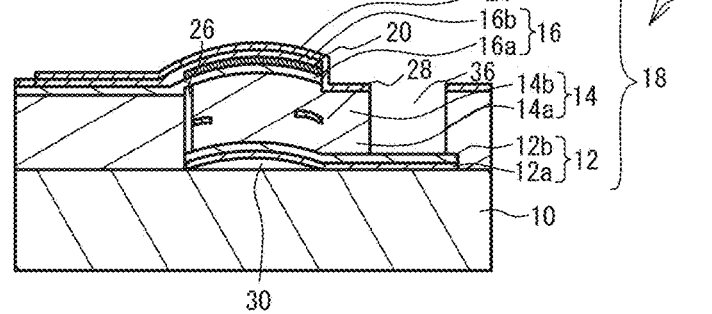

FIG. 9A is a plan view of a piezoelectric thin film resonator in accordance with a third embodiment, FIG. 9B is a plan view of an insertion film, and FIG. 9C and FIG. 9D are cross-sectional views taken along line A-A in FIG. 9A. FIG. 9C illustrates a series resonator of, for example, a ladder-type filter, and FIG. 9D illustrates a parallel resonator of, for example, a ladder-type filter. As illustrated in FIG. 9A through FIG. 9D, in the third embodiment, the insertion film 28 is located only in the outer peripheral region 52, and is not located outside the resonance region 50. Other configurations are the same as those of the first embodiment, and the description is omitted. As in the second embodiment, the piezoelectric film 14 other than under the upper electrode 16 may be removed.

Fourth Embodiment

Figure 10A:
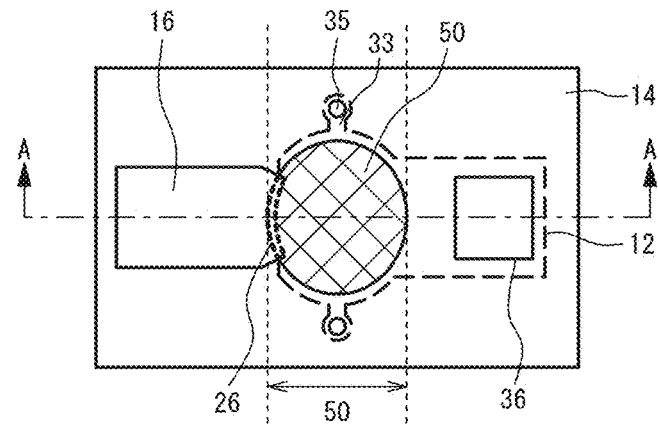
FIG. 10A is a plan view of a piezoelectric thin film resonator in accordance with a fourth embodiment.
Figure 10B:
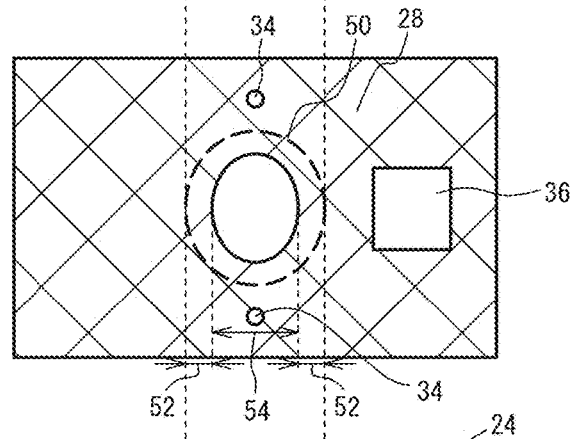
FIG. 10B is a plan view of an insertion film.
Figure 10C:
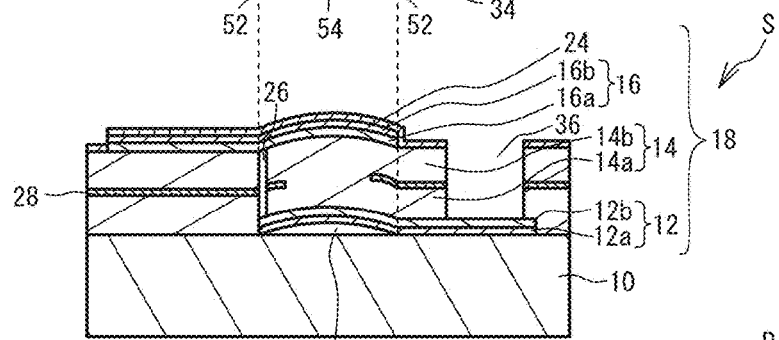
FIG. 10C and FIG. 10D are cross-sectional views taken along line A-A in FIG. 10A.
Figure 10D:
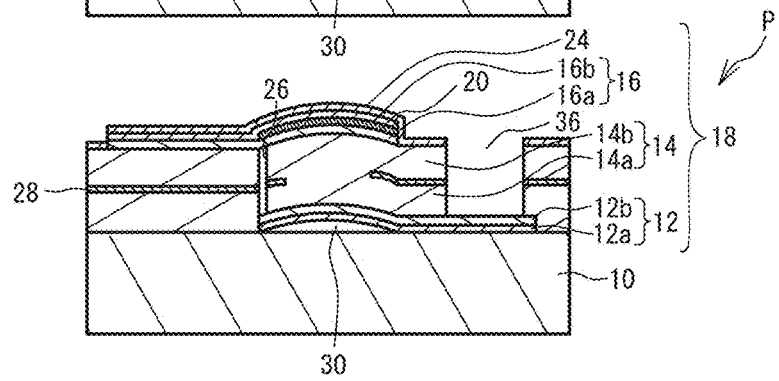

FIG. 10A is a plan view of a piezoelectric thin film resonator in accordance with a fourth embodiment, FIG. 10B is a plan view of an insertion film, and FIG. 10C and FIG. 10D are cross-sectional views taken along line A-A in FIG. 10A. FIG. 10C illustrates a series resonator of, for example, a ladder-type filter, and FIG. 10D illustrates a parallel resonator of, for example, a ladder-type filter. As illustrated in FIG. 10A through FIG. 10D, in the fourth embodiment, the insertion film 28 is located in the outer peripheral region 52 and outside the resonance region 50. A hole 34 communicating with the hole portion 35 is formed in the insertion film 28. The insertion film 28 is inserted into the piezoelectric film 14 except the piezoelectric film 14 in the center region 54, the hole 34, and the aperture 36. Other configurations are the same as those of the first embodiment, and the description is omitted.

As in the first embodiment, the insertion film 28 may be located in the region 56 surrounding the resonance region 50, and may not be located outside the region 56. As in the third embodiment, the insertion film 28 may not be necessarily located outside the resonance region 50. As in the fourth embodiment, the insertion film 28 may be located in the whole area outside the resonance region 50. In any cases above, the Q-value of the piezoelectric thin film resonator is improved.

The insertion film 28 is only required to be located in a part of the outer peripheral region 52. Even when the insertion film 28 is located in a part of the outer peripheral region 52, the acoustic wave is inhibited from leaking to the outside of the resonance region 50. The insertion film 28 is preferably located in at least 50% or more, more preferably 75% or more, further preferably 90% or more of the outer periphery of the resonance region 50.

Fifth Embodiment

Figure 11A:
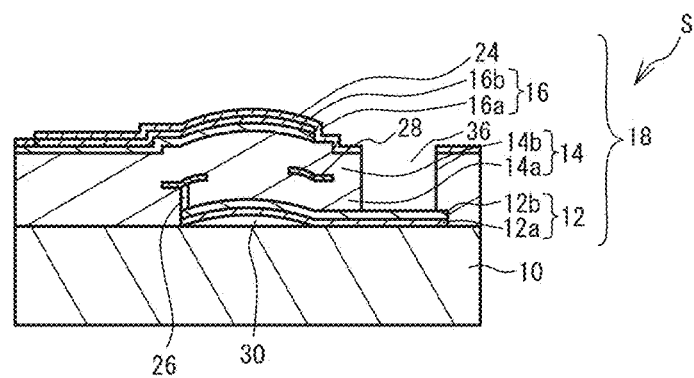
FIG. 11A and FIG. 11B are cross-sectional views of a piezoelectric thin film resonator in accordance with a fifth embodiment.
Figure 11B:
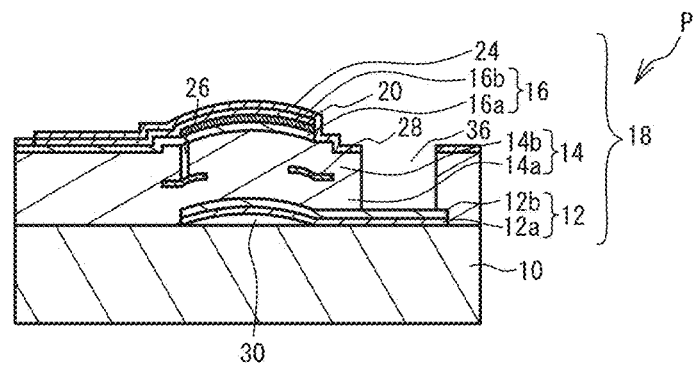

FIG. 11A and FIG. 11B are cross-sectional views of a piezoelectric thin film resonator in accordance with a fifth embodiment. As illustrated in FIG. 11A, the discontinuous portion 26 may be located in the lower piezoelectric film 14a located under the insertion film 28, and may not be necessarily located in the upper piezoelectric film 14b located on the insertion film 28. As illustrated in FIG. 11B, the discontinuous portion 26 may be located in the upper piezoelectric film 14b, and may not be necessarily located in the lower piezoelectric film 14a. As described above, the discontinuous portion 26 is only required to be located in a part of the piezoelectric film 14 in the film thickness direction. Other configurations are the same as those of the first embodiment, and thus the description is omitted.

Sixth Embodiment

Figure 12A:
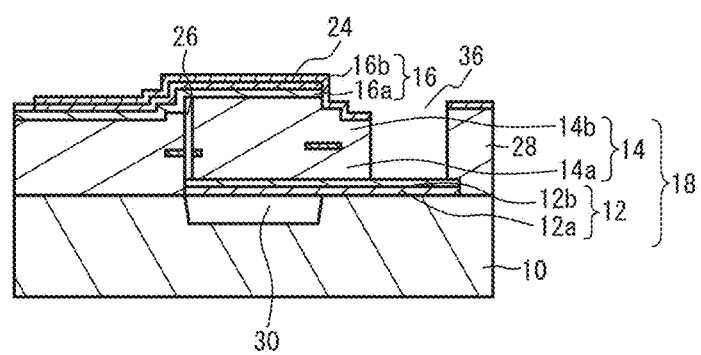
FIG. 12A is a cross-sectional view of a piezoelectric thin film resonator in accordance with a sixth embodiment.
Figure 12B:
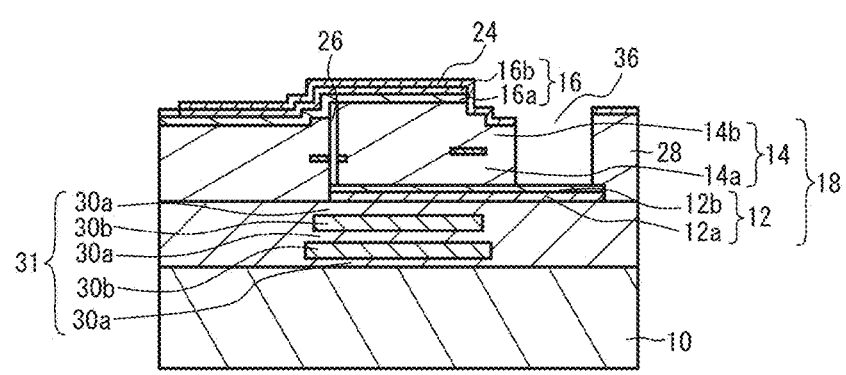
FIG. 12B is a cross-sectional view of a piezoelectric thin film resonator in accordance with a first variation of the sixth embodiment.

A sixth embodiment and a variation thereof changes the structure of the air gap. FIG. 12A is a cross-sectional view of a piezoelectric thin film resonator in accordance with the sixth embodiment, and FIG. 12B is a cross-sectional view of a piezoelectric thin film resonator in accordance with a first variation of the sixth embodiment. As illustrated in FIG. 12A, a recessed portion is formed in the upper surface of the substrate 10. The lower electrode 12 is flatly formed on the substrate 10. Thus, the air gap 30 is formed in the recessed portion of the substrate 10. The air gap 30 is formed so as to include the resonance region 50. Other configurations are the same as those of the first embodiment, and thus the description is omitted. The air gap 30 may be formed so as to penetrate through the substrate 10. An insulating film may be formed to make contact with the lower surface of the lower electrode 12. That is, the air gap 30 may be formed between the substrate 10 and an insulating film making contact with the lower electrode 12. The insulating film may be, for example, an aluminum nitride film.

As illustrated in FIG. 12B, an acoustic mirror 31 is formed under the lower electrode 12 in the resonance region 50. The acoustic mirror 31 includes a film 30a with a low acoustic impedance and a film 30b with a high acoustic impedance that are alternately stacked. Each of the films 30a and 30b has a film thickness of, for example, $\lambda/4$ ($\lambda$ is the wavelength of the acoustic wave). The stacking number of the film 30a and the film 30b can be freely selected. For example, the acoustic mirror 31 may have a structure in which a single film with an acoustic impedance different from that of the substrate 10 is located in the substrate 10. Other configurations are the same as those of the first embodiment, and thus the description is omitted.

In the first through fifth embodiments and the variation thereof, the air gap 30 may be formed as described in the sixth embodiment. Alternatively, as in the first variation of the sixth embodiment, the acoustic mirror 31 may be formed instead of the air gap 30.

As in the first through sixth embodiments and the variation thereof, the piezoelectric thin film resonator may be a Film Bulk Acoustic Resonator (FBAR) in which the air gap 30 is formed between the substrate 10 and the lower electrode 12 in the resonance region 50. Alternatively, as in the first variation of the sixth embodiment, the piezoelectric thin film resonator may be a Solidly Mounted Resonator (SMR) in which the acoustic mirror 31 reflecting the acoustic wave propagating through the piezoelectric film 14 is located under the lower electrode 12 in the resonance region 50.

The first through sixth embodiments and the variation thereof have described exemplary cases where the resonance region 50 has an elliptical shape. However the resonance region 50 may have other shape. For example, the resonance region 50 may have a polygonal shape such as a quadrangle shape or a pentagonal shape.

Seventh Embodiment

Figure 13:
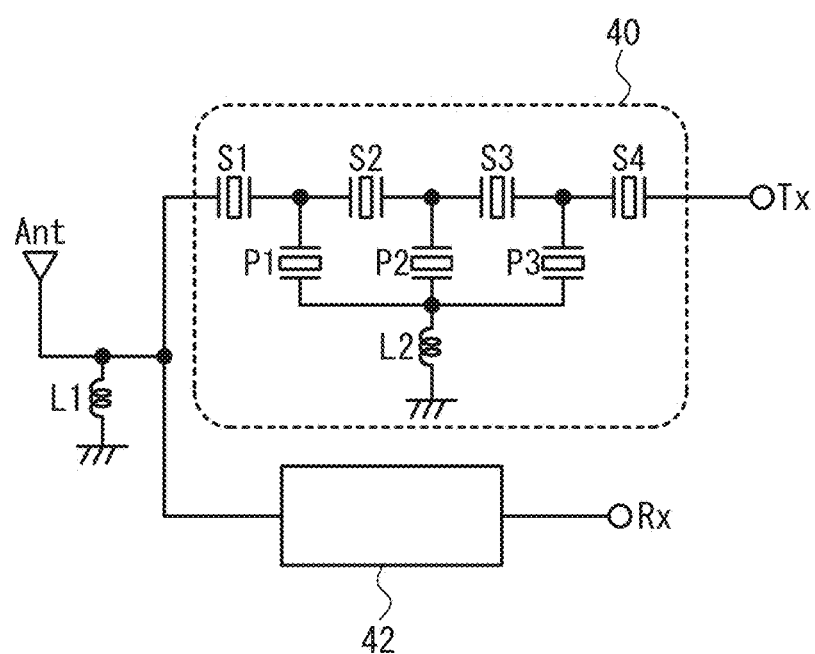
FIG. 13 is a circuit diagram of a duplexer in accordance with a seventh embodiment.

A seventh embodiment is an exemplary duplexer. FIG. 13 is a circuit diagram of a duplexer in accordance with a seventh embodiment. As illustrated in FIG. 13, the duplexer includes a transmit filter 40 and a receive filter 42. The transmit filter 40 is connected between a common terminal Ant and a transmit terminal Tx. The receive filter 42 is connected between the common terminal Ant and a receive terminal Rx. An inductor L1 as a matching circuit is located between the common terminal Ant and a ground. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. The inductor L1 matches impedance so that the transmission signal passing through the transmit filter 40 is output from the common terminal Ant without leaking from the receive filter 42.

The transmit filter 40 is a ladder-type filter. One or more series resonators S1 through S4 are connected in series between the transmit terminal Tx (an input terminal) and the common terminal Ant (an output terminal). One or more parallel resonators P1 through P3 are connected in parallel between the transmit terminal Tx and the common terminal Ant. Ground terminals of the parallel resonators P1 through P3 are commonly grounded through an inductor L2. The number and connection of the series resonators, the parallel resonators, and the inductors can be appropriately changed to obtain desired transmit filter characteristics. At least one of the series resonators S1 through S4 and the parallel resonators P1 through P3 may be the piezoelectric thin film resonator according to any one of the first through sixth embodiments and the variation thereof.

Figure 14A:
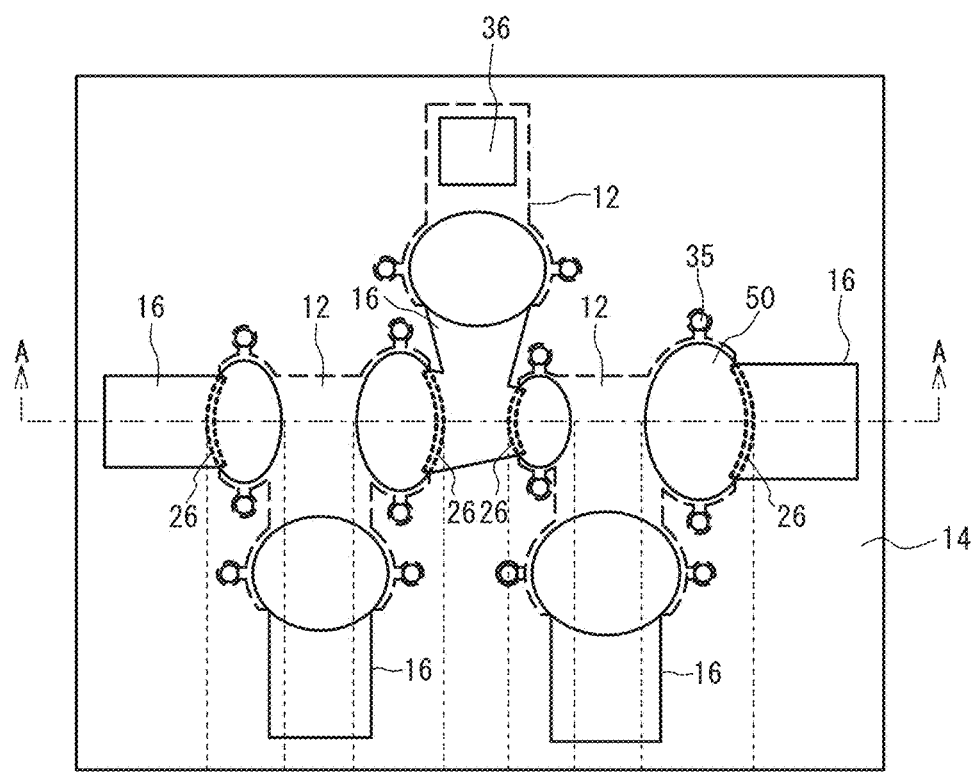
FIG. 14A is a plan view of a transmit filter.
Figure 14B:
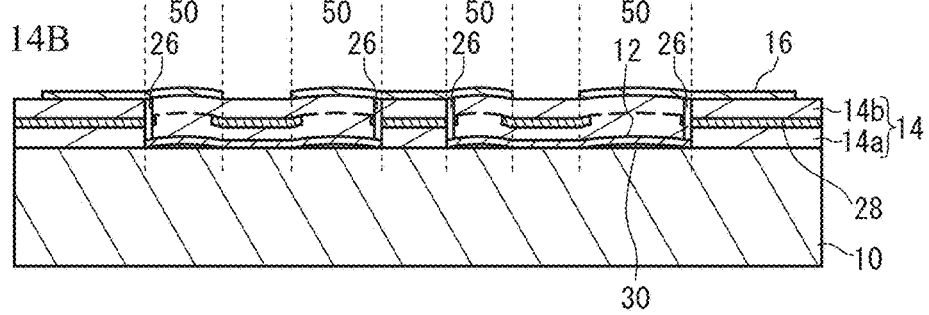
FIG. 14B is a cross-sectional view taken along line A-A in FIG. 14A.

FIG. 14A is a plan view of the transmit filter, and FIG. 14B is a cross-sectional view taken along line A-A in FIG. 14A. As illustrated in FIG. 14A and FIG. 14B, the piezoelectric thin film resonators in accordance with the first embodiment are formed on the single substrate 10 to form a ladder-type filter. The aperture 36 is formed in the piezoelectric film 14, and the aperture of the insertion film 28 is located in the same position as the aperture 36. An external element can be electrically coupled to the lower electrode 12 through these apertures. Other configurations are the same as those of the first embodiment, and the description is omitted. The size and shape of the resonance region 50 in each of the resonators S1 through S4 and P1 through P3 can be appropriately changed.

The receive filter 42 may be a ladder-type filter or a multimode filter. At least one of the transmit filter 40 and the receive filter 42 may be a ladder-type filter or a lattice-type filter. At least one of resonators of at least one of the transmit filter 40 and the receive filter 42 may be the piezoelectric thin film resonator according to any one of the first through sixth embodiments and the variation thereof.

A filter includes the piezoelectric thin film resonator according to any one of the first through sixth embodiments and the variation thereof. This configuration improves the Q-value of the resonator, and improves the skirt characteristic of the filter.

In addition, at least one of the transmit filter 40 and the receive filter 42 may be a filter including the piezoelectric thin film resonator according to any one of the first through sixth embodiments and the variation thereof.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
a substrate;
a lower electrode and an upper electrode located on the substrate; and
a piezoelectric film, at least a part of the piezoelectric film being sandwiched between the upper electrode and the lower electrode, the piezoelectric film including a discontinuous portion in which the piezoelectric film discontinues in at least a part of a region surrounding a center region that includes a center of a resonance region where the upper electrode and the lower electrode face each other across the at least a part of the piezoelectric film, wherein the discontinuous portion is located from a tip of the lower electrode and is not located in a region other than the tip of the lower electrode among the region surrounding the center region, wherein an air gap is located under the lower electrode, and wherein the discontinuous portion is located in a region in which an edge portion of the lower electrode substantially coincides with an edge portion of the air gap.

2. The piezoelectric thin film resonator according to claim 1, a cross-section of the discontinuous portion has a triangle shape or a trapezoidal shape having a width increasing toward the lower side.

3. The piezoelectric thin film resonator according to claim 1, further comprising:
an insertion film that is inserted in the piezoelectric film, is located in at least a part of an outer peripheral region within the resonance region, and is not located in the center region of the resonance region.

4. The piezoelectric thin film resonator according to claim 3, wherein
the discontinuous portion is located in the piezoelectric film located on or under the insertion film.

5. The piezoelectric thin film resonator according to claim 3, wherein
an acoustic impedance of the insertion film is less than an acoustic impedance of the piezoelectric film.

6. The piezoelectric thin film resonator according to claim 1, wherein
the discontinuous portion is a crack or an air gap located in the piezoelectric film.

7. A filter comprising:
the piezoelectric thin film resonator as set forth in claim 1.

8. The piezoelectric thin film resonator according to claim 1, wherein the discontinuous portion is located in an extraction region in which the upper electrode is extracted from the resonance region and is not located in a region other than the extraction region among the region surrounding the center region.

9. A piezoelectric thin film resonator, comprising:
a substrate;
a lower electrode and an upper electrode located on the substrate;
a piezoelectric film, at least a part of the piezoelectric film being sandwiched between the upper electrode and the lower electrode, the piezoelectric film including a discontinuous portion in which the piezoelectric film discontinues in at least a part of a region surrounding a center region that includes a center of a resonance region where the upper electrode and the lower electrode face each other across the at least a part of the piezoelectric film; and
an insertion film that is inserted in the piezoelectric film, is located in at least a part of an outer peripheral region within the resonance region, and is not located in the center region of the resonance region, wherein the discontinuous portion is located in the piezoelectric film located under the insertion film, and is not located in the piezoelectric film located on the insertion film.

10. The piezoelectric thin film resonator according to claim 9, wherein
an air gap or an acoustic mirror that includes the resonance region and is larger than the resonance region in planar view is located under the lower electrode, and
the discontinuous portion is located in an edge portion of the resonance region, further out than the edge portion of the resonance region and further in than an edge portion of the air gap or an edge portion of the acoustic mirror, or in the edge portion of the air gap or the edge portion of the acoustic mirror.

11. The piezoelectric thin film resonator according to claim 9, wherein
the discontinuous portion is located from a tip of the lower electrode.

12. The piezoelectric thin film resonator according to claim 9, wherein
an air gap is located under the lower electrode, and
the discontinuous portion is located in a region in which an edge portion of the lower electrode substantially coincides with an edge portion of the air gap.

13. A piezoelectric thin film resonator, comprising:
a substrate;
a lower electrode and an upper electrode located on the substrate;
a piezoelectric film, at least a part of the piezoelectric film being sandwiched between the upper electrode and the lower electrode, the piezoelectric film including a discontinuous portion in which the piezoelectric film discontinues in at least a part of a region surrounding a center region that includes a center of a resonance region where the upper electrode and the lower electrode face each other across the at least a part of the piezoelectric film; and
an insertion film that is inserted in the piezoelectric film, is located in at least a part of an outer peripheral region within the resonance region, and is not located in the center region of the resonance region, wherein the discontinuous portion is located in the piezoelectric film located on the insertion film, and is not located in the piezoelectric film located under the insertion film.

* * * * *